United States Patent
Kim et al.

(10) Patent No.: US 8,674,857 B2
(45) Date of Patent: Mar. 18, 2014

(54) APPARATUS AND METHOD FOR DECODING

(75) Inventors: Doo Hyun Kim, Seoul (KR); Do Hyung Kim, Gyeonggi-do (KR); Shi Hwa Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 531 days.

(21) Appl. No.: 13/586,416

(22) Filed: Aug. 15, 2012

(65) Prior Publication Data

US 2013/0229292 A1    Sep. 5, 2013

(30) Foreign Application Priority Data

Mar. 5, 2012   (KR) .................. 10-2012-0022338

(51) Int. Cl.
*H03M 7/40* (2006.01)

(52) U.S. Cl.
USPC .................. 341/65; 341/51; 341/50; 341/67

(58) Field of Classification Search
USPC .......................... 341/65, 67, 50, 51
See application file for complete search history.

(56) References Cited

U.S. PATENT DOCUMENTS

| | | | |
|---|---|---|---|
| 6,563,440 B1 * | 5/2003 | Kangas ............................ | 341/65 |
| 6,937,170 B2 * | 8/2005 | Otsuka ............................ | 341/67 |
| 7,020,327 B2 * | 3/2006 | Tack-don et al. ............. | 382/162 |
| 2010/0079315 A1 | 4/2010 | Chang | |
| 2010/0128795 A1 | 5/2010 | Lynch et al. | |
| 2010/0315269 A1 | 12/2010 | Wang et al. | |

FOREIGN PATENT DOCUMENTS

| | | |
|---|---|---|
| GB | 2483319 | 3/2012 |
| JP | 07-075100 | 3/1995 |
| KR | 10-0171819 | 10/1998 |
| KR | 10-0194205 | 2/1999 |
| KR | 10-1030726 | 4/2011 |

OTHER PUBLICATIONS

Y-W Chang et al., "Direct mapping architecture for JPEG Huffman decoder", IEE Proceedings: Communications, Institute of Electrical Engineers, GB, vol. 153, No. 3, Jun. 2, 2006, pp. 333-340.
Extended European Search Report dated Jun. 28, 2013 from European Patent Application No. 13157836.1.

* cited by examiner

*Primary Examiner* — Jean B Jeanglaude
(74) *Attorney, Agent, or Firm* — Staas & Halsey LLP

(57) ABSTRACT

A decoding apparatus and method store at least one table including at least one code, receive at least one instruction signal, and extract a symbol value and a symbol length from the at least one table based on the at least one instruction signal. The decoding apparatus calculates a target suffix length that minimizes the size of a generated table and minimizes the size of a non-prefix length of the at least one code.

25 Claims, 15 Drawing Sheets

FIG. 4

| total_zeros | \multicolumn{7}{c}{TotalCoeff(coeff_token)} |
| | 1 | 2 | 3 | 4 | 5 | 6 | 7 |
| --- | --- | --- | --- | --- | --- | --- | --- |
| 0 | 1 | 111 | 0101 | 0001 1 | 0101 | 0000 01 | 0000 01 |
| 1 | 011 | 110 | 111 | 111 | 0100 | 0000 1 | 0000 1 |
| 2 | 010 | 101 | 110 | 0101 | 0011 | 111 | 101 |
| 3 | 0011 | 100 | 101 | 0100 | 111 | 110 | 100 |
| 4 | 0010 | 011 | 0100 | 110 | 110 | 101 | 011 |
| 5 | 0001 1 | 0101 | 0011 | 101 | 101 | 100 | 11 |
| 6 | 0001 0 | 0100 | 100 | 100 | 100 | 011 | 010 |
| 7 | 0000 11 | 0011 | 011 | 0011 | 011 | 010 | 0001 |
| 8 | 0000 10 | 0010 | 0010 | 0010 | 0010 | 0001 | 001 |
| 9 | 0000 011 | 0001 1 | 0001 1 | 0001 0 | 0000 1 | 001 | 0000 00 |
| 10 | 0000 010 | 0001 0 | 0001 0 | 0000 01 | 0001 | 0000 00 | |
| 11 | 0000 0011 | 0000 11 | 0000 01 | 0000 1 | 0000 0 | | |
| 12 | 0000 0010 | 0000 10 | 0000 1 | 0000 0 | | | |
| 13 | 0000 00011 | 0000 01 | 0000 00 | | | | |
| 14 | 0000 00010 | 0000 00 | | | | | |
| 15 | 0000 00001 | | | | | | |

| Prefix | Suffix |
|---|---|
| | 111 |
| | 110 |
| | 101 |
| | 100 |
| | 011 |
| | 0101 |
| | 0100 |
| | 0011 |
| | 0010 |
| 000 | 11 |
| 000 | 10 |
| 000 | 01 |
| 000 | 001 |
| 000 | 000 |

FIG. 5D

| Prefix | Suffix |
|---|---|
|  | 111 |
|  | 110 |
|  | 101 |
|  | 100 |
| 0 | 11 |
| 0 | 101 |
| 0 | 100 |
| 0 | 011 |
| 0 | 010 |
| 000 | 11 |
| 000 | 10 |
| 000 | 01 |
| 000 | 001 |
| 000 | 000 |

FIG. 6

| Prefix | Suffix | total_zero | Suffix length |
|---|---|---|---|
| None | 111 | 1 | 3 |
| | 110 | 2 | 3 |
| | 101 | 3 | 3 |
| | 100 | 6 | 3 |
| | 011 | 7 | 3 |
| 0 | 101 | 0 | 3 |
| | 100 | 4 | 3 |
| | 011 | 5 | 3 |
| | 010 | 8 | 3 |
| 000 | 110 | 9 | 2 |
| | 111 | 9 | 2 |
| | 100 | 10 | 2 |
| | 101 | 10 | 2 |
| | 010 | 12 | 3 |
| | 011 | 12 | 3 |
| | 001 | 11 | 3 |
| | 000 | 13 | 3 |

FIG. 10

| Packing Bit Length | Non-prefix Length | Suffix Length | Offset Address |
|---|---|---|---|

APPARATUS AND METHOD FOR DECODING

CROSS-REFERENCE TO RELATED APPLICATIONS

This application claims the benefit of Korean Patent Application No. 10-2012-0022338, filed on Mar. 5, 2012, in the Korean Intellectual Property Office, the disclosure of which is incorporated herein by reference.

BACKGROUND

1. Field

Example embodiments of the following disclosure relate to a programmable Huffman decoding apparatus and method.

2. Description of the Related Art

Huffman coding is an example of a lossless compression method.

Video and audio standards developed to date generally use the Huffman lossless compression method.

The Huffman compression method estimates a probability value of a defined symbol and generates a Huffman tree from the estimated probability value, thereby creating a bit string including digital values of 0 and 1.

The Huffman compression method extracts an original symbol by comparing every bit string with a pre-generated Huffman table, during decoding.

According to the aforementioned typical characteristics of the Huffman compression method, a matching symbol may be found by checking the bit strings one by one.

According to the Huffman compression method, since probability characteristics of a symbol differ considerably depending on an application, different applications have different Huffman tables.

With regard to moving picture expert group (MPEG) which is a typical video standard, MPEG2 and MPEG4 define different Huffman tables from one another.

Therefore, in general, the Huffman compression method is implemented by software.

However, when software is used, comparison of every bit string with a table value is required, thereby considerably increasing an amount of calculation to be performed. In this case, a predetermined bit string may be stored in a memory and processed in groups.

However, processing in groups requires comparative calculation in units of a group. Also, a large capacity memory is necessary due to the storage of the Huffman table.

Accordingly, although hardware for high-speed processing has been developed, the hardware is inapplicable when an application is changed and each Huffman table is dedicatedly used for a particular application.

SUMMARY

The foregoing and/or other aspects are achieved by providing a decoding apparatus including a table storage unit to store at least one table including at least one code, a receiving unit to receive at least one instruction signal, and a symbol extraction unit to extract a symbol value and a symbol length from the at least one table based on the at least one instruction signal.

The at least one instruction signal may include a table configuration control signal, a Huffman prefix control signal, a Huffman suffix control signal, and a Huffman symbol decode control signal.

The decoding apparatus may further include a table generation unit to generate the at least one table.

The table generation unit may include an arrangement unit to arrange the at least one code in a descending order or an ascending order, a code separation unit to separate a suffix and a prefix of each of the at least one code respectively from each other such that the suffix corresponds to a target suffix length, and a group combination unit to combine suffix groups according to each prefix such that size of the at least one table is minimized.

The decoding apparatus may further include a bit calculation unit to calculate the target suffix length that minimizes the size of the table.

The bit calculation unit may include a suffix set unit to set the target suffix length to a minimum value, a detection unit to detect a code having a maximum length among codes not included in the at least one table, a calculation unit to calculate size of each of the at least one table, a first comparison unit to compare a previous table size with a current table size, and a second comparison unit to compare whether a current suffix length corresponds to a maximum suffix length.

The suffix set unit may set the target suffix length to the current suffix length when the previous table size is greater than the current table size.

The suffix set unit may increase the suffix length when the current suffix length is smaller than the maximum suffix length, and each of the modules repeats the aforementioned operations.

The decoding apparatus may further include a table configuration storage unit to store data related to each of the at least one table, a prefix storage unit to store at least one prefix generated based on each of the at least one table, and a mapping table storage unit to store symbol data related to the at least one code.

The table configuration storage unit may store data including an offset address corresponding to a first address on a mapping table of each of the at least one table, a suffix length and a non-prefix length of each of the at least one code, and a packing bit length for mapping at least two tables to one table.

The prefix storage unit may store a flag corresponding to a start bit of each of the at least one prefix.

The mapping table storage unit may store data including a symbol value corresponding to each of the at least one code, a suffix length of each of the at least one code, and a hit_flag for confirming a presence of a mapped code among the at least one code.

The symbol extraction unit may load a parameter corresponding to a table number from the table configuration storage unit and the prefix storage unit and calculates an address of a mapping table from a prefix extracted based on the parameter, thereby extracting the symbol value and the symbol length.

The foregoing and/or other aspects are achieved by providing a decoding method including storing at least one table including at least one code, receiving an at least one instruction signal, and extracting a symbol value and a symbol length from the at least one table based on the at least one instruction signal.

Additional aspects, features, and/or advantages of example embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the example embodiments, taken in conjunction with the accompanying drawings of which:

FIG. 4 illustrates a table according to example embodiments;

FIGS. 5A to 5D illustrate examples of a table structure according to example embodiments;

FIG. 6 illustrates an example table structure according to a prefix and a suffix, according to example embodiments;

FIG. 10 illustrates data stored in a table configuration storage unit shown in FIG. 9;

DETAILED DESCRIPTION

Figure 1:
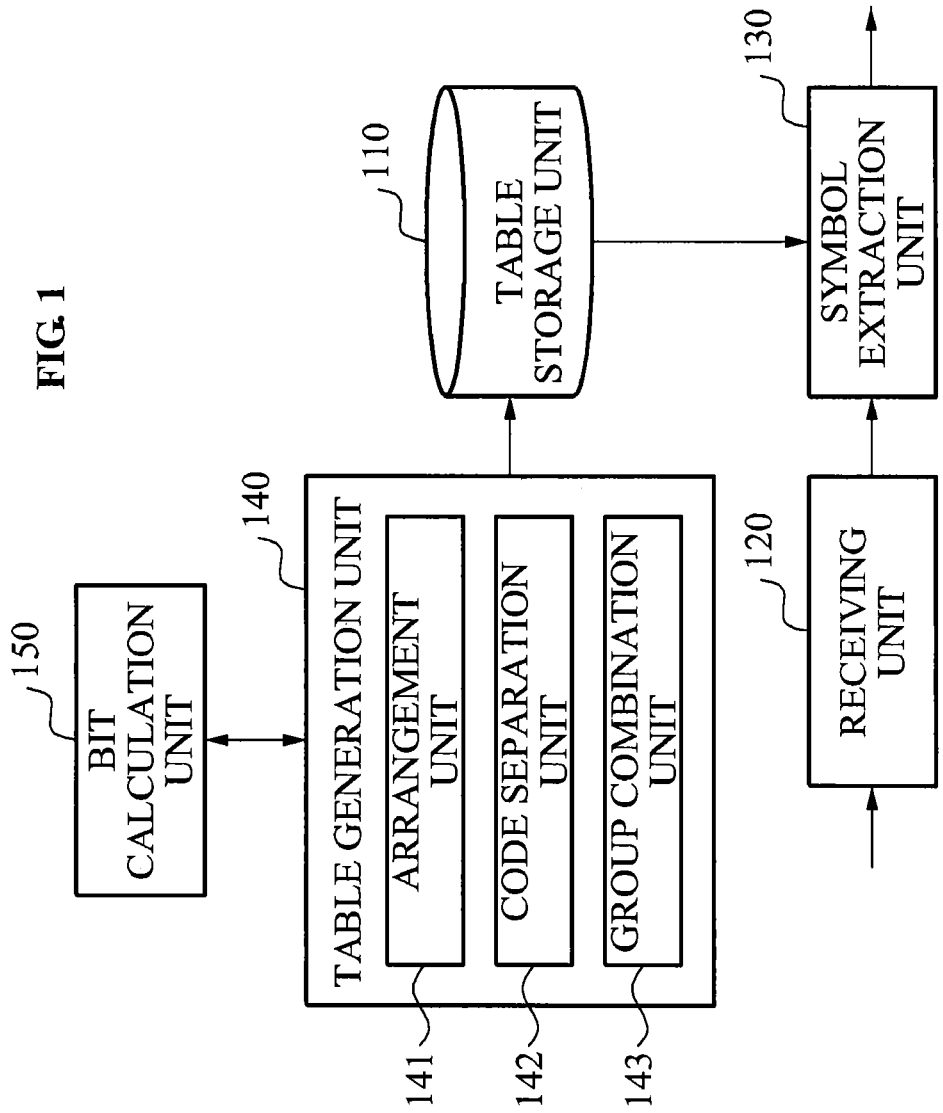
FIG. 1 illustrates a structure of a decoding apparatus according to example embodiments.

Reference will now be made in detail to example embodiments, examples of which are illustrated in the accompanying drawings, wherein like reference numerals refer to like elements throughout. Example embodiments are described below to explain the present disclosure by referring to the figures.

In the description of the present invention, if detailed descriptions of related disclosed art or configuration are determined to unnecessarily make the subject matter of the present invention obscure, they will be omitted. Terms to be used below are disclosed and utilized based on their functions in the present invention and may vary according to users, user's intentions, or practices. Therefore, the meanings of the terms should be determined based on the entire specification.

FIG. 1 illustrates a structure of a decoding apparatus according to example embodiments.

Referring to FIG. 1, the decoding apparatus may include a table storage unit 110 to store at least one table each including at least one code, a receiving unit 120 to receive at least one instruction signal, and a symbol extraction unit 130 to extract a symbol value and a symbol length from the at least one table based on the at least one instruction signal.

Figure 2:
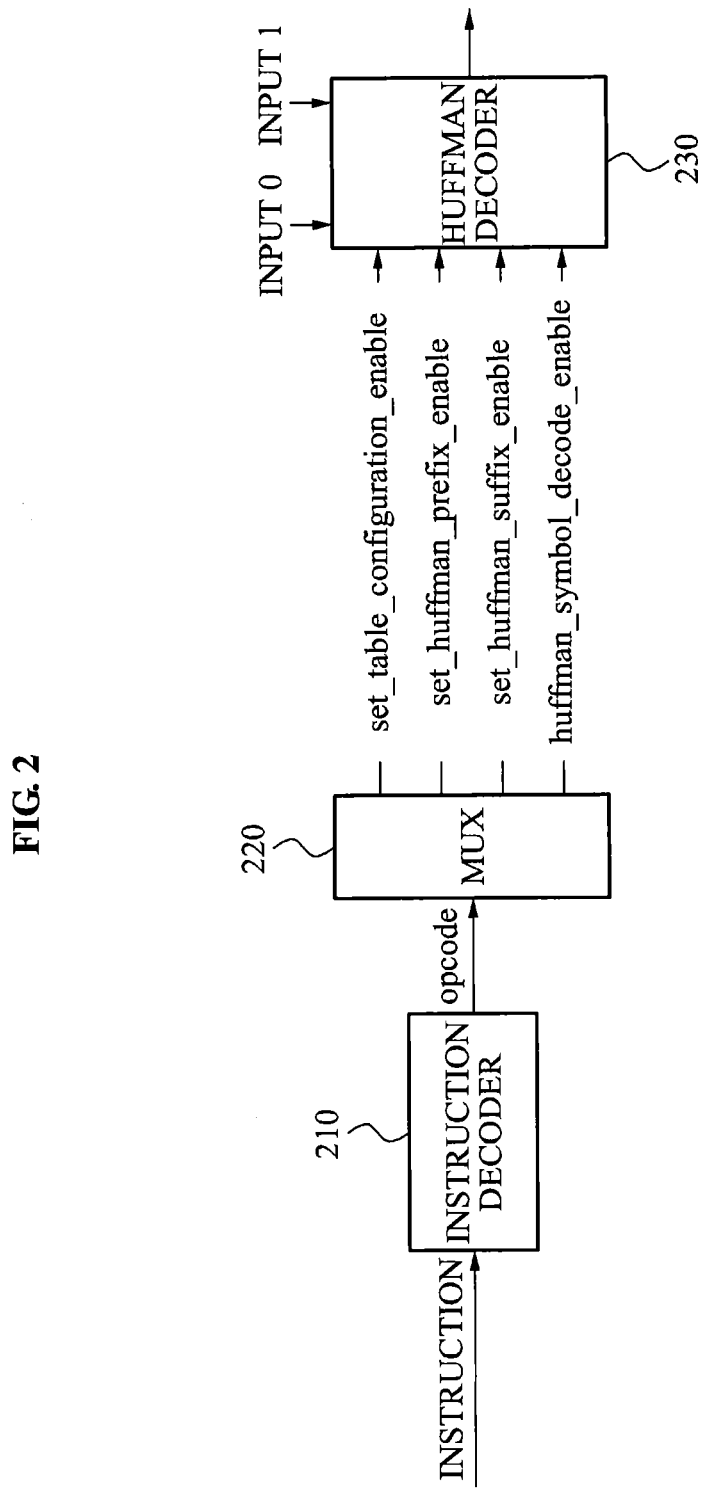
FIG. 2 illustrates an example instruction input to a decoding apparatus according to example embodiments.

FIG. 2 illustrates an example instruction input to a decoding apparatus according to example embodiments.

Referring to FIG. 2, the decoding apparatus according to the example embodiments may define a plurality of instruction signals to enable programming of Huffman decoding.

According to an aspect, an instruction decoder 210 may receive an instruction signal and transmit the instruction signal in the form of an opcode to a multiplexer (MUX) 220. The MUX 220 may multiplex the opcode into at least one instruction signal and transmit the at least one instruction signal to a Huffman decoder 230 that actually processes data, thereby extracting a symbol value and a symbol length of the at least one code.

According to the example embodiments, the at least one instruction signal may include one or more of a table configuration control signal, a Huffman prefix control signal, a Huffman suffix control signal, a Huffman symbol decode control signal, and the like.

Hereinafter, a decoding method using the decoding apparatus of FIG. 1 will be described.

Figure 3:
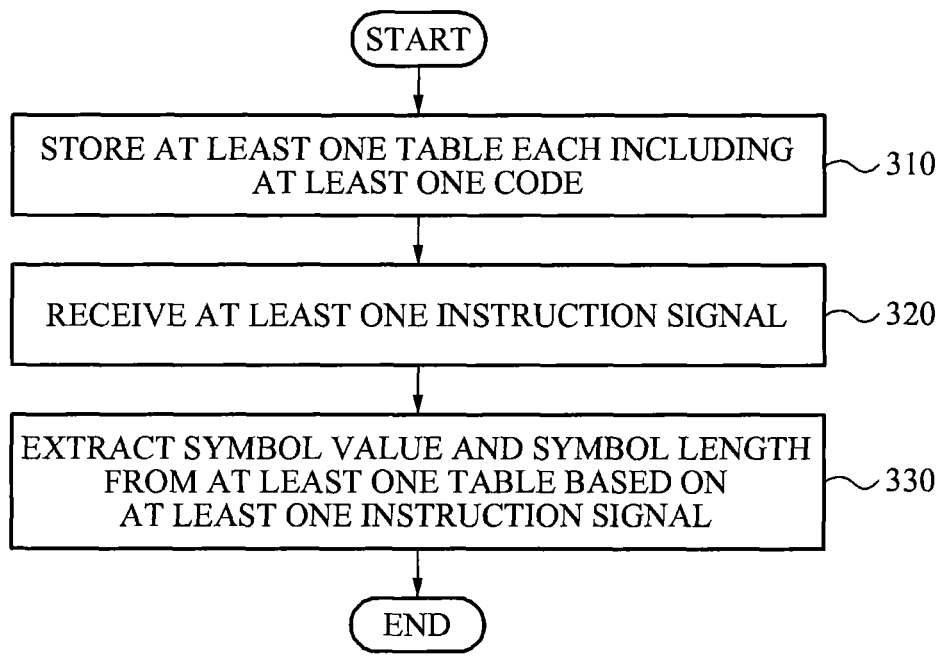
FIG. 3 illustrates a decoding method according to example embodiments.

FIG. 3 illustrates a decoding method according to example embodiments.

Referring to FIG. 3, in operation 310, the decoding apparatus may store at least one table each including at least one code.

In operation 320, the decoding apparatus may receive at least one instruction signal.

In operation 330, the decoding apparatus may extract a symbol value and a symbol length from the at least one table based on the at least one instruction signal.

Hereinafter, a table generation method according to example embodiments will be described.

A decoding apparatus according to the example embodiments may generate the at least one table using a table generation unit 140.

The table generation unit 140 may arrange the at least one code in a descending order or an ascending order using an arrangement unit 141.

The table generation unit 140 may separate a suffix and a prefix of each of the at least one code from each other, respectively, using a code separation unit 142 such that the suffix corresponds to a target suffix length.

The table generation unit 140 may combine suffix groups according to each prefix using a group combination unit 143 such that size of the at least one table is minimized.

FIG. 4 illustrates a table according to example embodiments. FIGS. 5A to 5D illustrate examples of a table structure according to example embodiments.

For example, the table generation unit 140 may code total_zero in a Huffman table used in H.264/AVC as shown in FIG. 4. Total_zero may refer to, for example, the number of zeroes before last non-zero coefficient. Also, when TotalCoeff is 3 as shown in FIG. 5A, the table generation unit 140 may generate a table with respect to a Huffman code in the following manner. TotalCoeff may refer to, for example, the total number of non-zero coefficients.

For example, the table generation unit 140 may arrange at least one code in the descending order as shown in FIG. 5B.

As shown in FIG. 5C, the table generation unit 140 may separate prefixes to correspond to 3 bits, that is, the target suffix length, such that the at least one code has the same prefix with respect to a longest code.

As shown in FIG. 5C, the table generation unit 140 may separate a next prefix to correspond to 3 bits which is the target suffix length with respect to a code having a maximum length from remaining codes except a group of codes having a prefix '000.'

The table generation unit 140 may generate a prefix group of prefixes '0' and '000.' Each of the prefixes may be represented by a suffix group.

FIG. 6 illustrates an example table structure according to a prefix and a suffix, according to example embodiments.

When a prefix may be found out from a predetermined bit stream, a decoding apparatus according to the example embodiments may generate and store a table as shown in FIG. 6 so that a result is extracted by only loading a predetermined suffix.

Although the example illustrates a process of generating the table with the target suffix length as 3 bits, the decoding apparatus according to the example embodiments may extract the target suffix length that minimizes a table size.

The decoding apparatus may calculate the target suffix length that minimizes the table size using a bit calculation unit 150.

Figure 7:
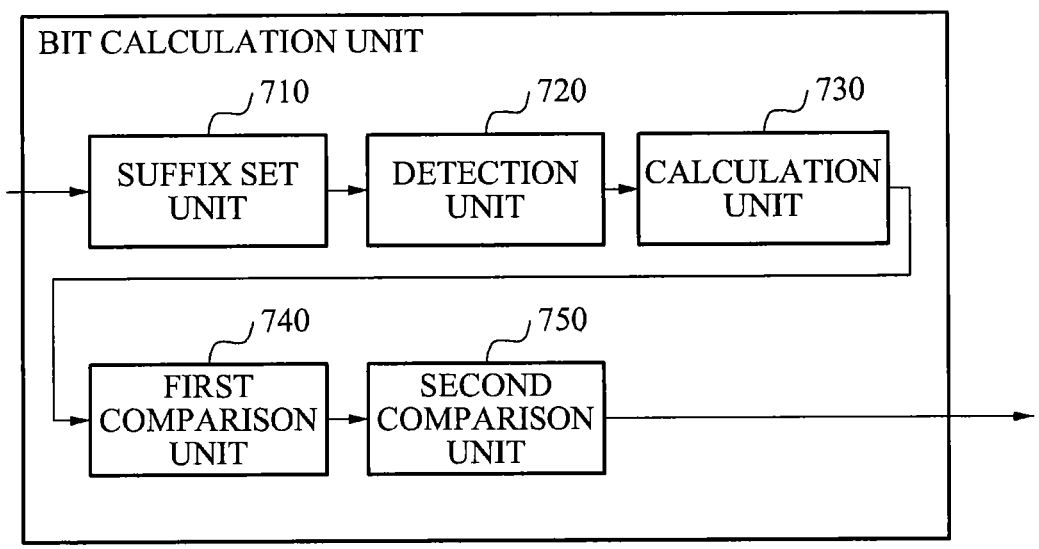
FIG. 7 illustrates a structure of a bit calculation unit according to example embodiments.
Figure 8:
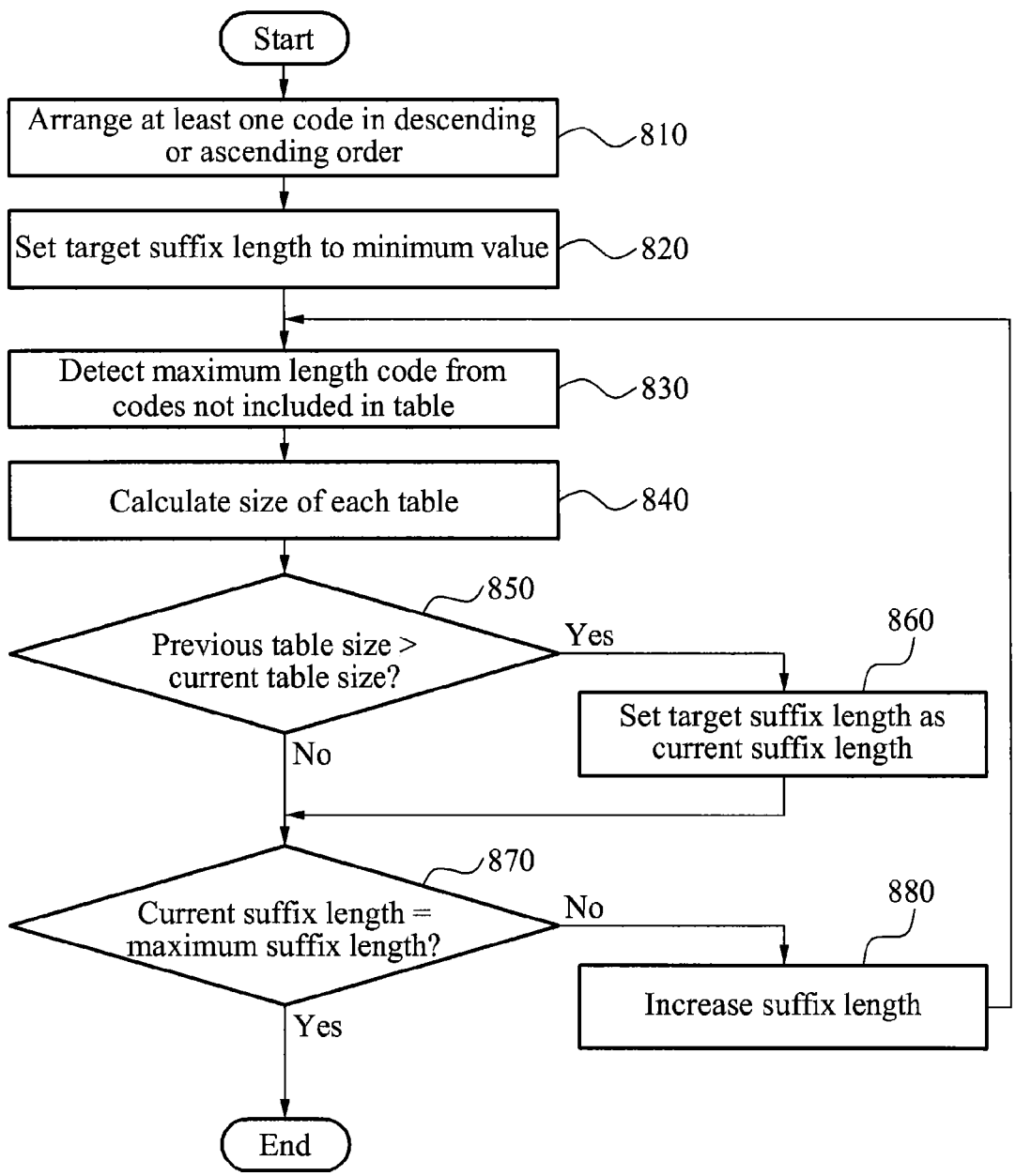
FIG. 8 illustrates a method of extracting a target suffix bit length according to example embodiments.

FIG. 7 illustrates a structure of a bit calculation unit according to example embodiments. FIG. 8 illustrates a method of extracting a target suffix length according to example embodiments.

Referring to FIGS. 7 and 8, in operation 810, the bit calculation unit may arrange at least one code in a descending order or an ascending order.

In operation 820, the bit calculation unit may set the target suffix length to a minimum value using a suffix set unit 710.

For example, the suffix set unit may initially set the target suffix length to binary value of 1 which is a minimum unit length.

In operation 830, the bit calculation unit may detect a code having a maximum length from codes not included in the table, using a detection unit 720.

In operation 840, the bit calculation unit may calculate size of each of the at least one table using a calculation unit 730.

In operation 850, the bit calculation unit may compare a previous table size with a current table size using a first comparison unit 740.

In operation 860, the suffix set unit may set the target suffix length as a current suffix length when the previous table size is greater than the current table size.

In operation 870, the bit calculation unit may compare whether the current suffix length corresponds to a maximum suffix length using a second comparison unit 750.

When the current suffix length is smaller than the maximum suffix length, the suffix set unit may increase the suffix length and repeat the aforementioned operations in operation 880.

Presuming that a prefix length is m bit, a non-prefix length is n bit, and a number of prefixes is c, the table size may be calculated using Equation 1.

$$\text{Table size}=2^n+c*2^m \quad \text{[Equation 1]}$$

The decoding apparatus may perform table mapping by calculating the target suffix length that minimizes the table size and the non-prefix length, by repeating each of the respective foregoing operations as many times as the maximum length of the code.

Hereinafter, a decoding method based on a circuit structure of a decoding apparatus according to example embodiments will be described.

Figure 9:
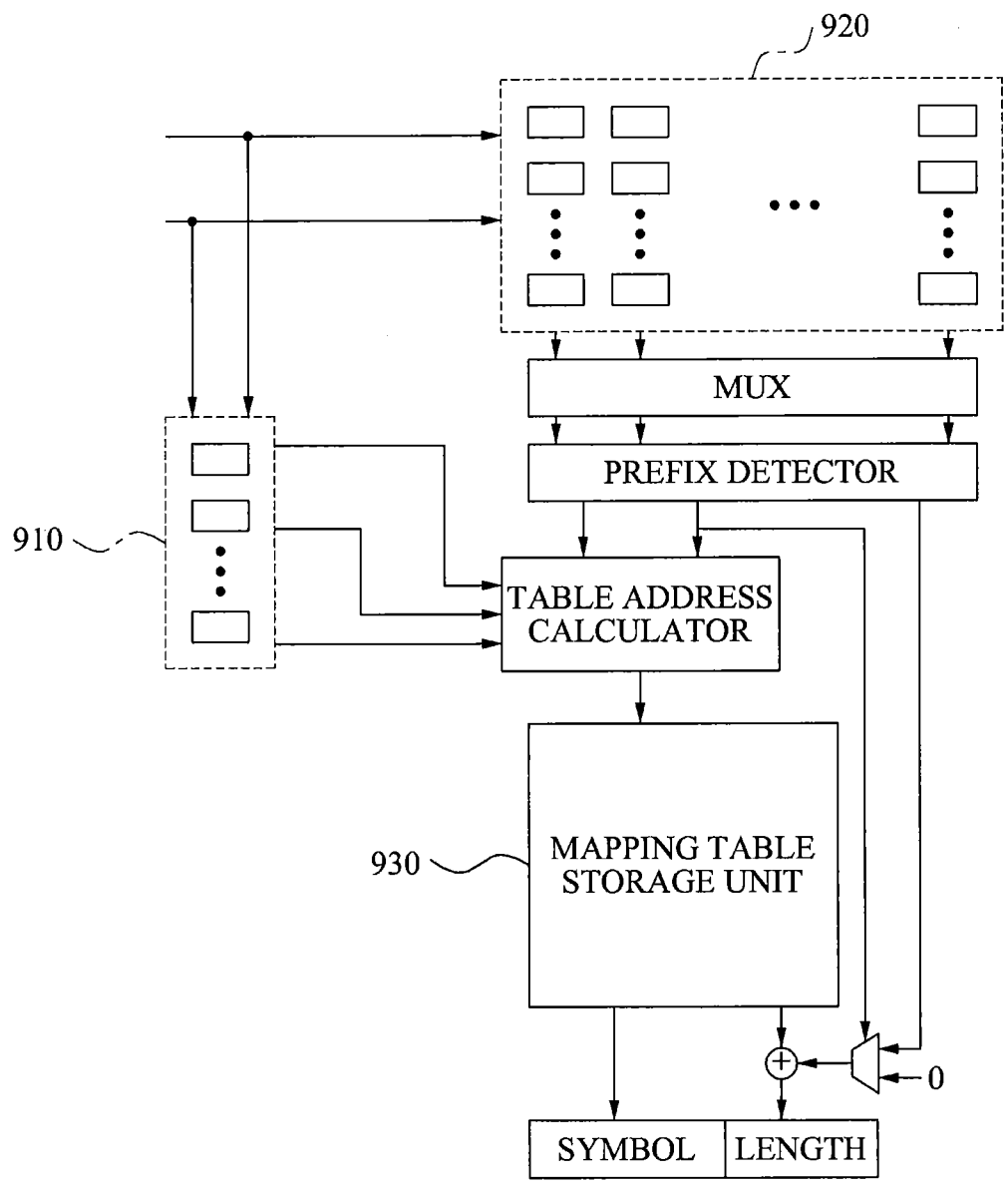
FIG. 9 illustrates a circuit structure of a decoding apparatus according to example embodiments.

FIG. 9 illustrates a circuit structure of a decoding apparatus according to example embodiments.

Referring to FIG. 9, the decoding apparatus may include a table configuration storage unit 910 storing data related to each table, a prefix storage unit 920 to store at least one prefix generated based on each table, and a mapping table storage unit 930 to store symbol data related to at least one code.

FIG. 10 illustrates data stored in the table configuration storage unit 910 of FIG. 9.

Referring to FIG. 10, the table configuration storage unit 910 may store an offset address corresponding to a first address on a mapping table of each table, a suffix length and a non-prefix length of each code, and a packing bit length for mapping at least two tables to one table.

Figure 11:
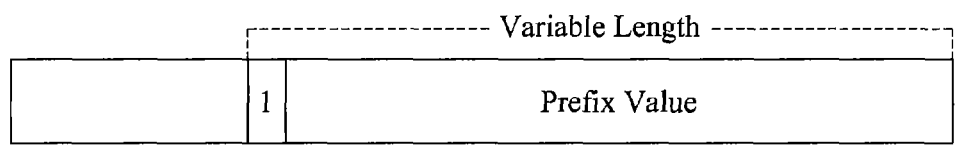
FIG. 11 illustrates data stored in a prefix storage unit shown in FIG. 9.

FIG. 11 illustrates data stored in the prefix storage unit 920 of FIG. 9.

Referring to FIG. 11, the prefix storage unit 920 may store a flag corresponding to a start bit of each prefix.

For example, the prefix storage unit 920 may set '1', which is a one bit value, ahead of each prefix value. The one bit value '1' may denote a flag indicating the start bit of the prefix.

The decoding apparatus may compare and extract the prefix value through the flag.

Figure 12:
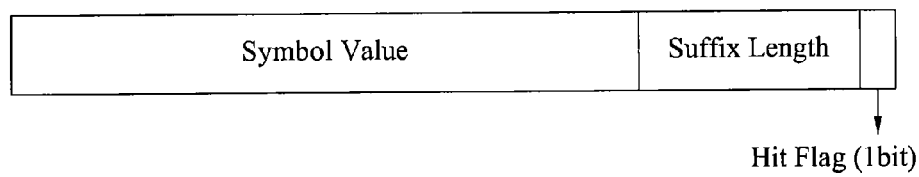
FIG. 12 illustrates data stored in a mapping table storage unit shown in FIG. 9.

FIG. 12 illustrates data stored in the mapping table storage unit 930 of FIG. 9.

Referring to FIG. 12, the mapping table storage unit 930 may store data including a symbol value corresponding to each code, a suffix length of each one code, and a hit_flag for confirming presence of a mapped code among at least one code.

For example, the symbol value may correspond to a Huffman code. The suffix length may denote a suffix length of an actual Huffman code.

The data stored in the mapping table storage unit 930 may be useful to process a code such as '00011' illustrated in FIG. 5B.

For example, a prefix and a suffix illustrated in FIG. 5B are both 3 bits, the prefix and the suffix may be mapped to both codes '000110' and '000111.'

However, since those codes are actually 2 bits, the mapping table needs to include the foregoing data.

The hit_flag is used for processing an escape-code. An escape-code may be processed when the presence of a mapped code does not exist among the at least one code. Since the escape-code does not comply with general Huffman coding, the escape-code may be separately processed.

When the escape-code is present, a decoding apparatus according to the example embodiments may store the hit_flag for confirming whether the mapping table includes the escape-code.

For example, the decoding apparatus may set a value stored with respect to each instruction signal in the following manner.

According to an aspect, the lengths of the non-prefix and the suffix in the table configuration storage unit 910 may both be 3. The prefix storage unit 920 may store '10' and '1000' since the prefix with respect to the table is '0' or '000.' The symbol value and the suffix length of the mapping table storage unit 930 may correspond to total_zero and the suffix length shown in FIG. 6.

A symbol extraction unit according to the example embodiments may extract the symbol value and the symbol length, by loading a parameter corresponding to a table number from the table configuration storage unit 910 and the prefix storage unit 920 and calculating an address of the mapping table from a prefix extracted based on the parameter.

According to the example embodiments, high speed Huffman coding may be achieved. Furthermore, by minimizing a table size, a required storage space may be reduced, and time required for a decoder to generate a table is reduced, increasing decoding speed.

Additionally, the example embodiments may be applied to various applications using Huffman coding. For example, the apparatus and method for decoding according to the above-described example embodiments may be used for video or audio decoding, such as for decoding a high definition video bit stream according to H.264/AVC, or may be used to decode a bit stream representing other information, such as textual information.

The apparatus and method for decoding according to the above-described example embodiments may use one or more processors, which may include a microprocessor, central processing unit (CPU), digital signal processor (DSP), or application-specific integrated circuit (ASIC), as well as portions or combinations of these and other processing devices.

The terms "module", and "unit," as used herein, may refer to, but is not limited to, a software or hardware component or device, such as a Field Programmable Gate Array (FPGA) or Application Specific Integrated Circuit (ASIC), which performs certain tasks. A module or unit may be configured to reside on an addressable storage medium and configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules/units may be combined into fewer components and modules/units or further separated into additional components and modules.

The methods according to the above-described example embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the example embodiments, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The media may be transfer media such as optical lines, metal lines, or waveguides including a carrier wave for transmitting a signal designating the program command and the data construction. Examples of program instructions include both machine code, such as produced by a compiler, and files including higher level code that may be executed by the computer using an interpreter. The described hardware devices may be configured to act as one or more software modules in order to perform the operations of the above-described example embodiments, or vice versa.

Each block of the flowchart illustrations may represent a unit, module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

Although example embodiments have been shown and described, it would be appreciated by those skilled in the art that changes may be made in these example embodiments without departing from the principles and spirit of the disclosure, the scope of which is defined in the claims and their equivalents.

What is claimed is:

1. A decoding apparatus comprising:
   a table storage unit to store at least one table including at least one code;
   a receiving unit to receive at least one instruction signal; and
   a symbol extraction unit to extract a symbol value and a symbol length from the at least one table based on the at least one instruction signal.

2. The decoding apparatus of claim 1, wherein the at least one instruction signal comprises a table configuration control signal, a Huffman prefix control signal, a Huffman suffix control signal, and a Huffman symbol decode control signal.

3. The decoding apparatus of claim 1, further comprising a table generation unit to generate the at least one table.

4. The decoding apparatus of claim 3, wherein the table generation unit comprises:
   an arrangement unit to arrange the at least one code in a descending order or an ascending order;
   a code separation unit to separate a suffix and a prefix of each of the at least one code from each other, respectively, such that the suffix corresponds to a target suffix length; and
   a group combination unit to combine suffix groups according to each prefix such that a size of the at least one table is minimized.

5. The decoding apparatus of claim 4, further comprising:
   a bit calculation unit to calculate the target suffix length that minimizes the size of the table.

6. The decoding apparatus of claim 5, wherein the bit calculation unit comprises:
   a suffix set unit to set the target suffix length to a minimum value;
   a detection unit to detect a code having a maximum length among codes not included in the at least one table;
   a calculation unit to calculate a size of each of the at least one table;
   a first comparison unit to compare a previous table size with a current table size; and
   a second comparison unit to compare whether a current suffix length corresponds to a maximum suffix length.

7. The decoding apparatus of claim 6, wherein the suffix set unit sets the target suffix length to the current suffix length when the previous table size is greater than the current table size.

8. The decoding apparatus of claim 6, wherein the suffix set unit increases the suffix length when the current suffix length is smaller than the maximum suffix length, and
   the table generation unit and the bit calculation unit iteratively perform respective operations to minimize a table size and to minimize a non-prefix length.

9. The decoding apparatus of claim 8, wherein the table generation unit and the bit calculation unit iteratively perform respective operations to minimize a table size and minimize a non-prefix length a number of times equal to or less than a length of the code having the maximum length among the codes.

10. The decoding apparatus of claim 1, further comprising:
    a table configuration storage unit to store data related to each of the at least one table;
    a prefix storage unit to store at least one prefix generated based on each of the at least one table; and
    a mapping table storage unit to store symbol data related to the at least one code.

11. The decoding apparatus of claim 10, wherein the table configuration storage unit stores data comprising:
    an offset address corresponding to a first address on a mapping table of each of the at least one table;
    a suffix length and a non-prefix length of each of the at least one code; and
    a packing bit length for mapping at least two tables to one table.

12. The decoding apparatus of claim 10, wherein the prefix storage unit stores a flag corresponding to a start bit of each of the at least one prefix.

13. The decoding apparatus of claim 10, wherein the mapping table storage unit stores data comprising:
    a symbol value corresponding to each of the at least one code;
    a suffix length of each of the at least one code; and a hit_flag for confirming a presence of a mapped code among the at least one code.

14. The decoding apparatus of claim 10, wherein the symbol extraction unit loads a parameter corresponding to a table number from the table configuration storage unit and the prefix storage unit and calculates an address of a mapping table from a prefix extracted based on the parameter, thereby extracting the symbol value and the symbol length.

15. A decoding method comprising:
   storing at least one table including at least one code;
   receiving at least one instruction signal; and
   extracting a symbol value and a symbol length from the at least one table based on the at least one instruction signal.

16. The decoding method of claim 15, wherein the at least one instruction signal comprises a table configuration control signal, a Huffman prefix control signal, a Huffman suffix control signal, and a Huffman symbol decode control signal.

17. The decoding method of claim 15, further comprising:
   arranging the at least one code in a descending order or an ascending order;
   separating a suffix and a prefix of each of the at least one code respectively from each other such that the suffix corresponds to a target suffix length; and
   combining suffix groups according to each prefix such that a size of the at least one table is minimized.

18. The decoding method of claim 17, further comprising calculating the target suffix length that minimizes the size of the at least one table.

19. The decoding method of claim 18, wherein the calculating of the target suffix length comprises:
   setting the target suffix length to a minimum value;
   detecting a code having a maximum length among codes not included in the at least one table;
   calculating a size of each of the at least one table;
   comparing a previous table size with a current table size; and
   comparing whether a current suffix length corresponds to a maximum suffix length.

20. The decoding method of claim 19, wherein the calculating of the target suffix length further comprises setting the target suffix length to the current suffix length when the previous table size is greater than the current table size.

21. The decoding method of claim 19, wherein the calculating of the target suffix length further comprises increasing the suffix length when the current suffix length is smaller than the maximum suffix length, and
   iteratively performing the calculating of the target suffix length, to minimize a table size and to minimize a non-prefix length.

22. The decoding method of claim 21, wherein iteratively performing is performed a number of times equal to or less than a length of the code having the maximum length among the codes.

23. The decoding method of claim 15, further comprising:
   storing data related to each of the at least one table;
   storing at least one prefix generated based on each of the at least one table; and
   storing symbol data related to the at least one code.

24. The decoding method of claim 23, further comprising:
   loading a parameter corresponding to a table number selected from the at least one table; and
   extracting the symbol value and the symbol length by calculating an address of a mapping table from a prefix extracted based on the parameter.

25. A non-transitory computer readable recording medium storing a program to cause a computer to implement the method of claim 15.

* * * * *